United States Patent
Poradish et al.

[11] Patent Number: 6,113,043
[45] Date of Patent: Sep. 5, 2000

[54] MOUNT FOR INTEGRATED CIRCUIT DEVICE

[75] Inventors: Frank J. Poradish, Plano; Jerry L. Taylor, McKinney, both of Tex.

[73] Assignee: Texas Instruments Incorporated, Dallas, Tex.

[21] Appl. No.: 09/002,150

[22] Filed: Dec. 31, 1997

Related U.S. Application Data

[60] Provisional application No. 60/034,686, Jan. 6, 1997.

[51] Int. Cl.⁷ .................................................. A47B 96/06
[52] U.S. Cl. ................................. 248/220.22; 219/69.15
[58] Field of Search ............................. 248/224.8, 27.1, 248/27.3, 220.22, 226.12, 346.04, 220.31, 220.41, 220.42; 403/59; 219/69.15, 86.25

[56] References Cited

U.S. PATENT DOCUMENTS

| | | | |
|---|---|---|---|
| 4,683,736 | 8/1987 | Weinerman et al. | 248/27.3 |
| 4,789,769 | 12/1988 | Warner | 219/86.25 |
| 4,866,374 | 9/1989 | Cedrone | 324/158 F |
| 5,062,604 | 11/1991 | Monnier | 248/27.1 |
| 5,465,927 | 11/1995 | Chun-Jung | 248/27.1 |
| 5,847,350 | 12/1998 | Dorrel et al. | 248/220.22 |

*Primary Examiner*—Ramon O. Ramirez
*Assistant Examiner*—Tan Le
*Attorney, Agent, or Firm*—Charles A. Brill; Frederick J. Telecky, Jr.; Richard L. Donaldson

[57] ABSTRACT

A mount (10) for an integrated circuit, which permits the integrated circuit to be accurately positioned relative to other system components. The mount (10) rests on a base (200) that is part of some other system component and that has two mounting posts (210). The main body of the mount (10) is a frame (110) that holds the integrated circuit and has post apertures (120) that receive the mounting posts (210). The frame (110) has interior channels (170) that extend from the post aperture and that contain plunger/spring pairs (150, 160). A screw (181) pushed against a wedge-shaped end (152) of a plunger (150) causes the plunger (150) to push against a mounting post (210), causing the mount (10) to move relative to the base (200). The plunger/spring pairs (150, 160) provide translational and rotational adjustments. A tripod arrangement of set screws (181) provides adjustment of tilt and height. An inner frame (53) can be added to provide for electrical connections.

20 Claims, 4 Drawing Sheets

6,113,043

MOUNT FOR INTEGRATED CIRCUIT DEVICE

This application claims priority under 35 U.S.C. 119(e)(1) of provisional application Ser. No. 60/034,686, filed Jan. 6, 1997.

TECHNICAL FIELD OF THE INVENTION

The present invention relates generally to integrated circuits, and more particularly to a mount for an integrated circuit, the mount permitting the integrated circuit to be precisely positioned as a component in a system.

BACKGROUND OF THE INVENTION

Integrated circuits (ICs) are increasingly being incorporated into systems other than data processing systems, where they may be used for any number of purposes. Just a few uses of ICs are signal control, data processing, and sound or image generation. Micro-mechanical ICs are even used as tiny machines.

Sometimes the physical positioning of the IC within the system is critical to optimum system performance. An example is a digital micro-mirror device (DMD), which is used to generate images for display. The DMD must be precisely positioned with respect to optical devices so that the image will be correctly focussed. Positioning is especially important in a display system that uses multiple DMDS, each of which concurrently generate an image of a different color. The images are combined to provide a full-color image, which requires the DMDs to be correctly positioned so that the images will register.

SUMMARY OF THE INVENTION

The invention described herein is directed to a mount for an integrated circuit (IC), which is to be mounted on a base having one or more mounting posts. In its simplest form, the mount is designed for a base having a single mounting post. The main body of the mount is a frame having an outer wall and an inner wall, with the inner wall being the same shape as the perimeter of the IC but slightly larger. This permits the mount to receive the IC, which is held within the frame so that the mount and the IC move together. The frame has a post aperture, situated between the outer wall and the inner wall, for receiving the mounting post.

For translational adjustment along a first axis of motion, the frame has a plunger channel and a spring channel, which each extend from the post aperture into the frame in a plane substantially parallel to the plane of the frame. The plunger channel and the spring channel are on opposing sides of the post aperture. A spring is inserted into the spring channel, and a plunger is inserted into the plunger channel, thereby resulting in a first plunger/spring pair. The plunger is wedge-shaped at the end away from the post aperture, and an adjustment aperture in the frame receives a screw that bears down on the wedge-shaped end. The extent to which the screw is inserted into the adjustment aperture determines the extent to which the other end of the plunger extends into the post aperture. As the plunger extends into the post aperture, the mount moves in the opposite direction.

The above-described embodiment can be enhanced with additional plunger/spring pairs for a second translational adjustment. This second translational adjustment is along an axis of motion orthogonal to that of the first translational adjustment.

For rotational adjustment, a second post aperture can be used with a base having two posts. A plunger/spring pair at one post aperture would provide rotation in one direction, and a plunger/spring pair at the other post aperture would provide rotation in the other direction. In this variation, translational adjustment could be provided with a plunger/spring pair at a single post aperture, or by a plunger/spring pair with the plunger at one post aperture and the spring at the other post aperture.

For tilt and height adjustments, the frame may have three aperture arranged in a triangular pattern. These apertures receive a set of "tripod" screws, which can be individually adjusted (for tilt) or adjusted in common (for height).

An advantage of the mount is that it provides for accurate positioning of an IC within a system that uses the IC. The mount may be designed with a second frame, which fits inside the first frame and which receives elastomeric electrical connections for the IC. As a result, the mount integrates the functions of mounting, positioning, and electrically connecting the IC with respect to other components of a system of which the IC is a component.

The mount may provide adjustment along a single axis of motion or along as many as six axes of motion. For whatever axis or axes of motion the mount provides, the accuracy of the adjustment is in the order of a single micron. Furthermore, once positioned, the IC will remain in position.

If the IC is to be positioned relative to a particular other component of a system, the path between the IC and that component may be made short, straight, and stiff. This ensures a secure mechanical coupling.

BRIEF DESCRIPTION THE DRAWINGS

FIG. 1 an exploded perspective view of a mount in accordance with the invention.

FIG. 2 a cross-sectional view of the post apertures of the mount of FIG. 1, as used with a base having mounting posts.

FIG. 3 is a schematic plan view of the mount of FIG. 1, illustrating adjustment along (or about) three axes of motion.

FIG. 4 illustrated the channels associated with one of the post apertures of the mount of FIG. 1.

DETAILED DESCRIPTION OF THE INVENTION

Figure 1:
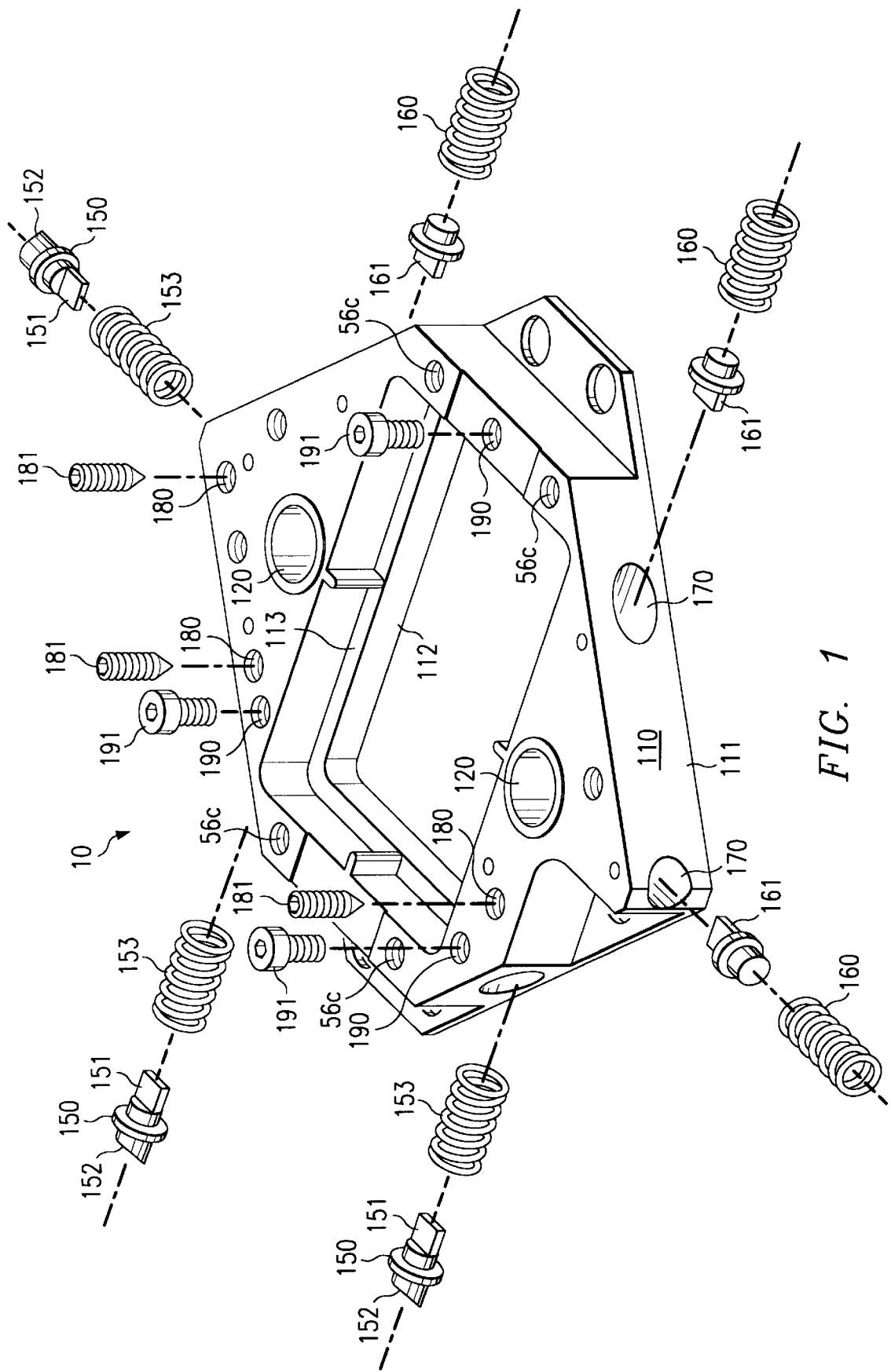

FIG. 1 is an exploded perspective view of a mount 10 in accordance with the invention. As explained below, in the embodiment of FIG. 1, the mount 10 permits adjustment along six axes of motion. However, simpler versions can provide for adjustment along only one, two, three, four, or five axes of motion.

The main body of mount 10 is a frame 110 having an outer wall 111 and an inner wall 112. Inner wall 112 is shaped so as to receive an integrated circuit (IC) and is thus the same shape as, and slightly larger than, the perimeter of the integrated circuit.

Inner wall 112 encloses at least part of a "floor". In FIG. 1, a partial floor 113 permits the IC to be dropped into the area inside inner wall 112 at an upper surface of frame 110 and to be prevented from falling out from the lower surface. In other embodiments, the lower surface of frame 110 could be closed rather than open, such that the IC rests against the bottom of the area inside inner wall 112. Other suitable means for holding the IC inside inner wall 112 could be used. Regardless of the means for holding the IC inside the inner wall 112, once the IC is placed with mount 10, the mount 10 and the IC move as a single unit.

The thickness of the inner wall 112, that is, the distance between the upper and lower surface of frame 110 at the inner wall 112, is sufficient to substantially contain the IC. As explained below in connection with FIG. 5, this thickness may also be sufficient to contain a holder for electrical connectors that connect the IC to other system components.

Frame 110 may be made from any rigid material, and is typically made from molded plastic. The lower surface of mount 10 is flat and smooth or otherwise designed to provide low friction motion of mount 10 relative to a base upon which the lower surface rests.

Figure 2:
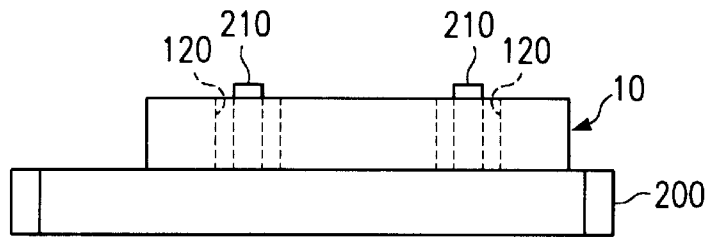

FIG. 2 is a cross sectional view of the two post apertures 120 of FIG. 1, also showing mount 10 placed on a base 200. Base 200 has two posts 210, each of which are inserted into a post aperture 120.

Figure 3:
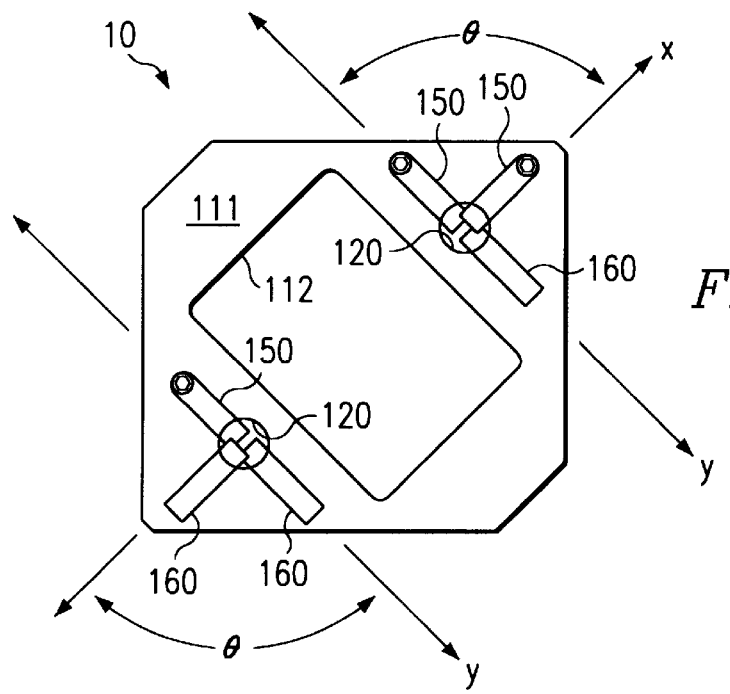

FIG. 3 is a schematic plan view of the upper surface of mount 10, more clearly illustrating how mount 10 is moveable relative to base 200. Although posts 210 are not shown in FIG. 3, the inner diameter of each aperture 120 is larger than the outer diameter of the post 210 it receives. This permits mount 10 to be moved in a plane parallel to the base 200.

As illustrated in FIG. 3, mount 10 is capable of both translational motion (along an x or y axis) or rotational motion (about θ). However, in other embodiments, only one type of motion (translational or rotational) may be required. It might also be the case that translational motion is required along only one axis (x or y), either alone or in combination with rotational motion.

The larger the post aperture 120 relative to the post 210, the greater the range of motion that may be accomplished. In a typical embodiment, the range of motion is in the order of 0.02 inches relative to the base 200, along (or about) any of the three axes of motion.

Referring to both FIGS. 1 and 3, a system of plungers 150 and return springs 160 control the motion of mount 10 relative to base 200. These plungers 150 and springs 160 are inserted into channels 170 inside frame 110. The channels 170 are in a plane parallel to the plane of the lower surface of mount 10. In the example of this description, where there are three plunger/spring pairs, there are six channels, one for each plunger 150 and one for each return spring 160.

Each channel 170 opens into one of the two post apertures 120. Three channels 170 open into one post aperture 120, and three channels 170 open into the other.

Figure 4:
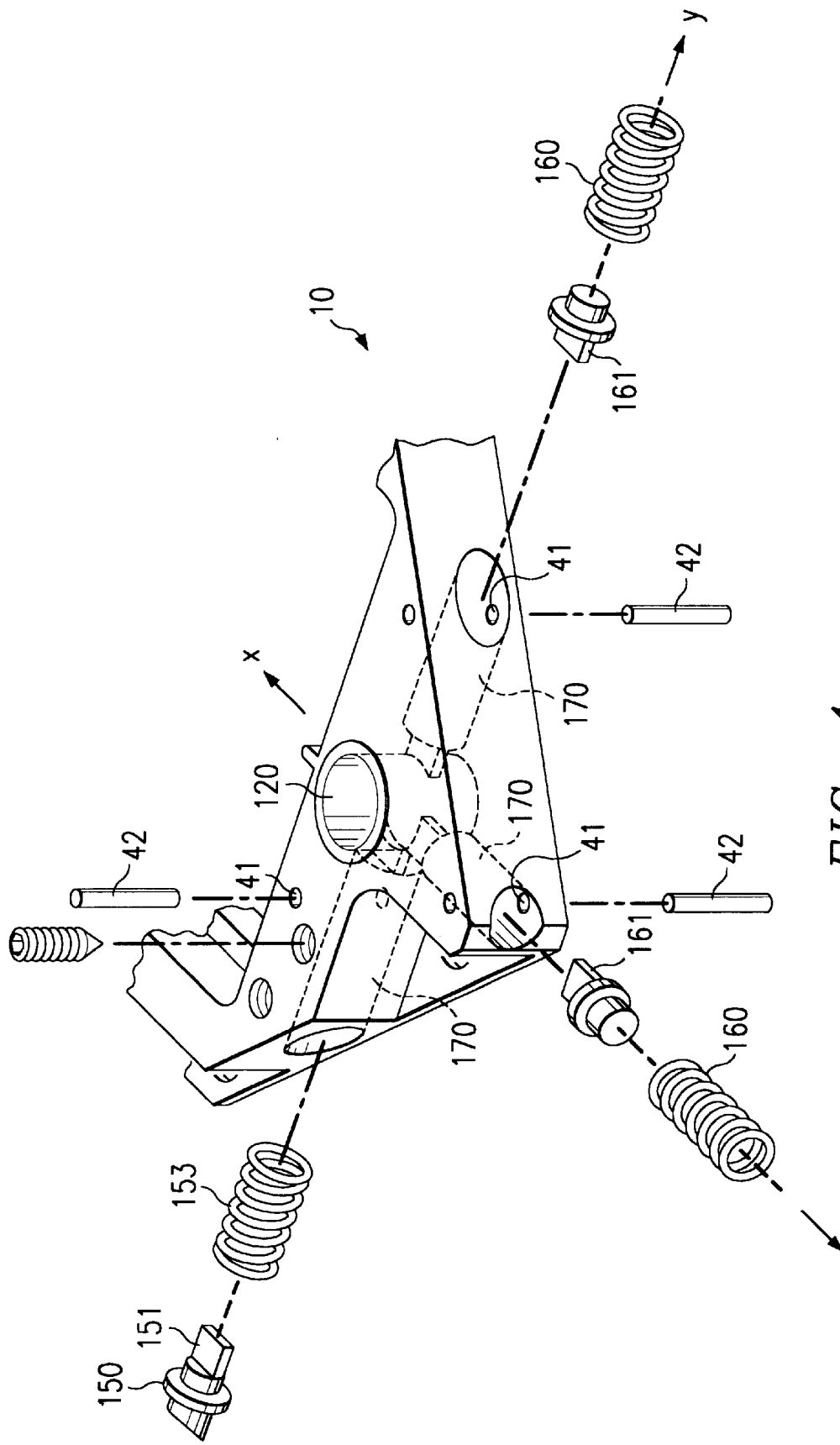

FIG. 4 is a more detailed view of one corner of mount 10, showing a post aperture 120 and its associated channels 170, plunger 150 and drive spring 153, and two return springs 160. Two channels 170 each contain a return spring 160. A third channel 170 contains a plunger 150 and a drive spring 153.

FIG. 4 also shows the use of apertures 41 and pins 42 to hold each plunger 150 and spring 160 in place inside its associated channel 170. Each channel 170 extends all the way from its associated post aperture 120 to the outer wall 111 of frame 110. This permits each plunger 150 or spring 160 to be inserted into its channel 170 from the outer wall 111 and then held in place with a pin 42 inserted into an aperture 41. However, any other suitable means of holding plungers 150 and springs 160 in place may be used. For example, each channel 170 could open only into a post aperture 120 so that it is close-ended. Then, plungers 150 and springs 160 could be placed in the channel 170 during fabrication or subsequently as permitted by the particular configuration.

Referring to FIGS. 1–4, each plunger 150 has an opposing return spring 160. The plunger 150 and spring 160 of a plunger/spring pair may be at the same post aperture 120 or they may be at different post apertures 120. The embodiment of FIGS. 1–4 illustrates both configurations.

Referring especially to FIG. 3, post apertures 210 are aligned along the x axis of motion. For adjustments along this axis, one post aperture 120 has a plunger 150 and one post aperture 120 has an opposing spring 160. For adjustments along the y axis, both post apertures 120 each have a plunger 150 and a spring 160.

Referring to FIGS. 1–4, each plunger 150 has a tab end 151 that is capable of extending into a post aperture 120. A drive spring 153 may be placed over tab end 151 to provide additional counterforce against plunger 150.

Like plungers 150, each spring 160 has a tab end 161 that is capable of extending into a post aperture 120. Thus, each post aperture 120 receives three tab ends 151 or 161.

Each plunger 150 has a wedge-shaped outer end 152, which is the end away from post aperture 120. Three wedge access apertures 180 in frame 110 each permit access to one of these wedge-shaped outer ends 152. As illustrated in FIG. 1, a pointed screw 181 may be inserted into a wedge access aperture 180. The further the screw 181 is inserted into aperture 180, the further tab end 151 of plunger 150 extends into post aperture 120. For low friction, screw 181 may be made from metal and wedge end 152 from plastic.

When mount 10 is placed on base 200 having posts 210 and screw 181 is extended down into wedge access aperture 180, tab 151 bears against a post 210. This causes mount 10 to move relative to the base 200. The direction of motion is opposite to the bearing force. Each plunger's 150 opposing spring 160 provides a counterforce.

Thus, for adjustments along the x axis, the plunger/spring pair along that axis is used. A screw 181 in the appropriate wedge aperture 180 is pushed in or backed out, thereby changing the extent to which plunger 150 extends into aperture 120 and pushes against post 210. The spring 160 on the other post 210 provides an opposing force.

For adjustments along the y axis, the two plunger/spring pairs along the y axis are similarly used. In this case, the plunger/spring pairs are at the same post aperture 210.

For rotational adjustments, one of the plungers 150 along a y axis is used. The choice of which plunger 150 is adjusted determining the direction of the adjustment.

The use of tabs 151 and 161 extends the range of motion of mount 10 relative to base 200. The two tabs 151 and 161 for one plunger/spring pair are at a different level within post aperture 120 than the two tabs 151 and 161 for any other plunger/spring pair. This may be accomplished by arranging channels 170 at different levels or by simply locating tabs 151 and 161 at different positions at the ends of their respective plungers 150 or springs 160. In other embodiments, the ends of plungers 150 and springs 160 could rest directly against post 210.

In the example of this description, post apertures 120 extend from the lower surface of frame 110 to the upper surface. This permits access to the mounting post 210 from the upper surface of the frame 110. In other embodiments, post aperture 120 could extend upward into frame 110 from lower surface only a distance sufficient to receive posts 210 and to permit channels 170 to contain plungers 150 and springs 160 such that their inner ends may push against posts 210.

Referring to FIG. 1, mount 10 may also provide for tilt and height adjustment. Frame 110 has three tripod apertures 190 extending from the upper surface to the lower surface. Apertures 190 are arranged in a substantially triangular pattern. Each aperture 190 receives a tripod screw 191, which rests on base 200. Each screw 191 may be inserted into its aperture 190 to a different extent. By individually adjusting screws 191, the tilt of mount 100 relative to base 200 can be adjusted. The height of mount 10 can be adjusted by adjusting all set screws 191 the same extent. Adjustment is facilitated if the ends of screws 191 that bear on base 200 are rounded. The above-described system of plungers 150 and springs 160 permits mount 100 to be adjusted along three axes, e.g., translational in two dimensions and rotational. The system of tripod screws 191 provides adjustment along three additional axis of motion, e.g., tilt in both directions and height. Thus, the combination of the plunger/spring pairs and the tripod screws provides a full six degrees of freedom of motion.

Figure 5:
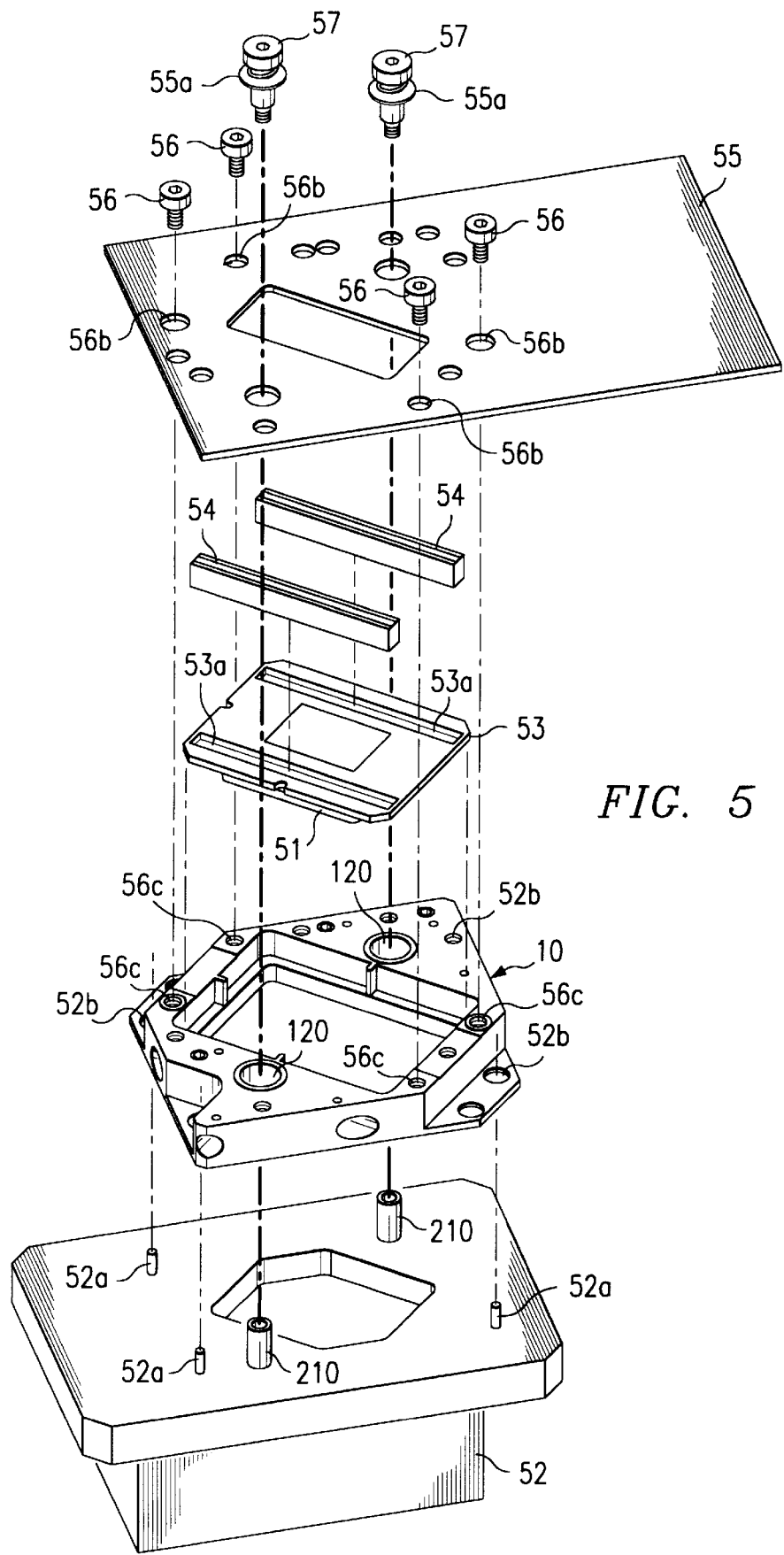
FIG. 5 illustrates the mount of FIG. 1, used to mount a digital micro-mirror device on an optical unit and to provide electrical connection to a circuit board.

FIG. 5 illustrates mount 10 used to position a digital micro-mirror device (DMD) 51 with respect to an optical unit 52. DMD 51 is dropped into mount 10 and held in place within mount 10 by means of the inner surface 112 and shelf 113 of frame 110, as described above in connection with FIG. 1.

A holder 53 is placed over DMD 51. Holder 53 has slots 53a, each of which receive an elastomeric electrical connector strip 54. Holder 53 may be made from any suitable material, such as plastic.

Holder 53 and connectors 54 are seated within inner wall 112 over DMD 51. The depth of inner wall 112 above shelf 113 is such that connectors 54 are slightly raised from the upper surface of mount 10.

Once holder 53 and connectors 54 are in place, circuit board 55 is placed over them and clamped to the upper surface of mount 10. This clamping is accomplished with screws 56 through apertures 56b in circuit board 55. Referring again to FIG. 1, screws 56 are inserted into apertures 56c in frame 110. By means of this clamping, connectors 54 connect electrical pads on DMD 51 to electrical pads on circuit board 55. This "socket" type of electrical interface avoids the need for soldering, which might damage components of the DMD 51. It also accommodates the large number of DMD pins to be connected to circuit board 55.

Optical unit 52 has an upper surface that is comparable to base 200 of FIG. 2. Thus, the two posts 210 extending from this upper surface, correspond to the two posts 210 of FIG. 2. These posts have corresponding post apertures 120 in frame 110. As explained above, apertures 120 are larger than posts 210, so as to permit mount 100 to be repositioned relative to optical unit 52 (or any base 200).

Although the plunger/spring pairs 150 and 160 are designed to hold whatever adjustment to which they are set, FIG. 5 illustrates how further stability may be provided. The upper surface of optical unit 52 (comparable to base 200) has three potting pins 52a. These potting pins 52a correspond to apertures 52b in frame 110. When mount 10 is placed on base 10, the apertures 52b receive potting pins 52a. Once mount 10 is positioned, it may then be epoxied into place using epoxy applied to apertures 52b. For convenience, circuit board 55 could have additional apertures (not shown) corresponding to apertures 52b, such that epoxy could be applied from the upper surface of the entire assembly.

As indicated in the Background, adjustment is especially critical in a DMD display system that uses multiple DMDs. When the assembly of FIG. 5 is installed in such a system, various adjustments can be made until the image projected by the DMD is properly positioned. Then, the images of the other DMD(s) are aligned with the first image.

Figure 6:
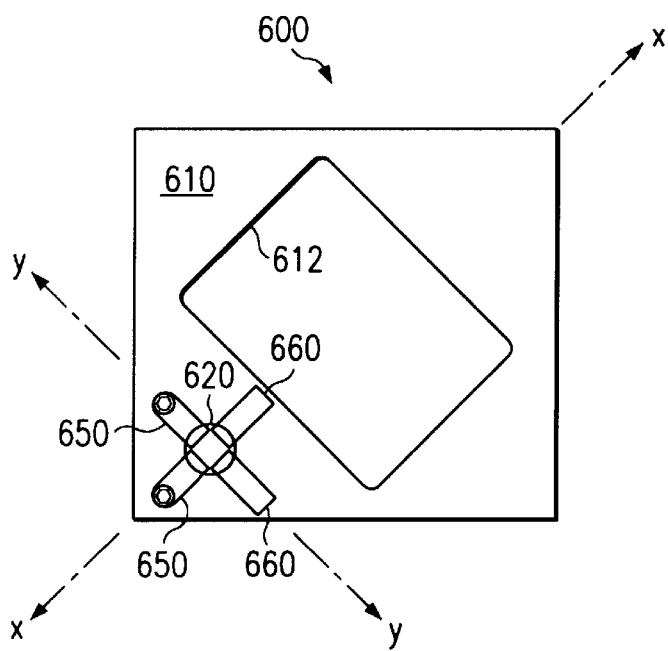
FIG. 6 illustrates a simplified embodiment of a mount in accordance with the invention, the mount having only a single post aperture.

FIG. 6 is a schematic plan view of a simplified version of the mount of FIG. 1, a mount 60 having only one post aperture 610. It is designed for use with a base having a single mounting post. A frame 610 has an inner wall 612, which receives an IC, in a manner similar to the frame 110 of mount 10.

Frame 610 has four channels 670, each extending from post aperture 620. Two channels 670 each contain a plunger 650. Two channels each contain a spring 660 that opposes a plunger 650. Plungers 650 have wedge-shaped ends, so that a screw can be used to adjust the distance that the plungers 650 extend into their associated channel 670, as described above. In this manner, mount 60 permits adjustment along x and y axis of motion. If rotation is not desired, tracks or other guides could be used. A variations of mount 60 would be the use of only one plunger/spring pair for adjustment along only one axis of motion (x or y). The addition of a system of tripod apertures and screws like the apertures 190 and screws 191 of FIG. 1, would permit height and tilt adjustment.

Other Embodiments

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A mount operable to mount an integrated circuit to a base having a mounting post, comprising:

a frame, said frame having an outer wall and an inner wall, said inner wall shaped to receive said integrated circuit, said frame also having an upper surface and a lower surface, said lower surface having a post aperture operable to receive said mounting post, and said frame having at least one plunger channel and one spring channel extending from said post aperture into said frame in a plane substantially parallel to said lower surface, such that said plunger channel and said spring channel are on opposing sides of said post aperture;

a spring inserted into said spring channel, said spring having an inner end capable of extending into said post aperture;

a plunger inserted into said plunger channel, said plunger having an inner end capable of extending into said post aperture, and said plunger having a wedge-shaped outer end;

wherein said upper surface of said frame has a wedge access aperture over said outer end of said plunger.

2. The mount of claim 1, wherein said inner wall encloses at least a partial floor operable to hold said integrated circuit inside said inner wall.

3. The mount of claim 1, wherein said frame has an additional plunger channel and an additional spring channel, and wherein said mount has an additional said spring and an additional said plunger, such that said mount has two plunger/spring pairs, each one of said plunger/spring pairs being substantially orthogonal to the other.

4. The mount of claim 3, wherein said inner end of each said spring and said inner end of each said plunger is a tab, such that each plunger/spring pair has a pair of opposing tabs, and wherein each said pair of opposing tabs is at a different level than the other said pair of opposing tabs.

5. The mount of claim 1, wherein said frame has three tripod apertures arranged in a substantially triangular pattern, each said tripod aperture containing a tripod screw having an end that is capable of extending from said lower surface of said frame and resting on a base.

6. The mount of claim 1, wherein said post aperture extends through the entire thickness of said frame so as to permit access to said mounting post from said upper surface of said frame.

7. The mount of claim 1, further comprising an electrical connection holder inside said inner wall.

8. A mount operable to mount an integrated circuit on a base having at least two mounting posts, comprising:
   a frame, said frame having an outer wall and an inner wall, said inner wall shaped to receive said integrated circuit, said frame also having an upper surface and a lower surface, said lower surface having two post apertures, each operable to receive one of said mounting posts, and said frame having at least one spring channel extending from one said post aperture and at least one opposing plunger channel extending from the other said post apertures, said spring channel and said plunger channel extending into said frame substantially parallel to said lower surface;
   a spring inserted into said spring channel, said spring having an inner end capable of extending into said post aperture;
   a plunger inserted into said plunger channel, said plunger having an inner end capable of extending into said post aperture, and said plunger having a wedge-shaped outer end;
   wherein said upper surface of said frame has a wedge access aperture over said outer end of said plunger.

9. The mount of claim 8, wherein said inner wall enclosed at least a partial floor operable to hold said integrated circuit inside said inner wall.

10. The mount of claim 8, wherein said frame has an additional plunger channel and an additional spring channel, both extending from one of said post apertures, and wherein said mount has an additional said spring and an additional said plunger, such that said mount has two plunger/spring pairs, each one of said plunger/spring pairs being substantially orthogonal to the other.

11. The mount of claim 9, wherein said inner end of each said spring and said inner end of each said plunger is a tab, such that each plunger/spring pair has a pair of opposing tabs, and wherein each said pair of opposing tabs is at a different level than the other said pair of opposing tabs.

12. The mount of claim 8, wherein said frame has two additional plunger channels, one extending from each of said post apertures, and two-additional spring channels, one extending from each of said post apertures, and wherein said mount has two additional said springs and two additional said plungers such that said mount has three plunger/spring pairs, with two of said plunger/spring pairs being substantially orthogonal to a third of said plunger/spring pairs.

13. The mount of claim 8, wherein said frame has three tripod apertures arranged in a substantially triangular pattern, each said tripod aperture containing a tripod screw having an end that is capable of extending from said lower surface of said frame and rests on said base.

14. The mount of claim 8, wherein said post aperture extends through the entire thickness of said frame so as to permit access to said mounting post from said upper surface of said frame.

15. The mount of claim 8, further comprising an electrical connection holder inside said inner-wall.

16. The mount of claim 8, wherein each of said channels extend from an associated one of said post apertures to said outer wall of said frame.

17. A method of mounting an integrated circuit to a base having at least one mounting post, comprising the steps of:
   placing said integrated circuit inside a frame, said frame having a post aperture operable to receive said mounting post;
   using a plunger and counterspring to adjust the position of said mount relative to said base by extending or retracting a screw that bears against a wedge-shaped end of said plunger whose other end bears against said mounting post, said spring also bearing against said post so as to provide a counterforce to said plunger; and
   placing an electrical connection holder over said integrated circuit and inside said frame, said holder having slots operable to receive a strip of electrical connectors.

18. The method of claim 17, wherein said step of using a plunger and spring is performed by using a plunger that moves said mount along a first translational axis and further comprising the step of using a second plunger and a second spring to adjust the position of said mount along a second translational axis.

19. The method of claim 17, wherein said step of using a plunger and spring is performed by using a plunger that moves said mount along a translational axis and further comprising the step of using a second plunger and a second spring to adjust the position of said mount about a rotational axis.

20. The method of claim 17, further comprising the step of using a set of tripod apertures extending through the thickness of said frame and a corresponding set of tripod screws inserted into said tripod apertures to vertically adjust said mount relative to said base.

* * * * *